United States Patent
Puschini Pascual et al.

(10) Patent No.: US 9,729,156 B2
(45) Date of Patent: Aug. 8, 2017

(54) SUPPLY DEVICE FOR SUPPLYING AN ELECTRONIC CIRCUIT

(71) Applicant: Commissariat A L'Energie Atomique et Aux Energies Alternatives, Paris (FR)

(72) Inventors: Diego Puschini Pascual, Meylan (FR); Suzanne Lesecq, Froges (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/406,973

(22) PCT Filed: Jun. 19, 2013

(86) PCT No.: PCT/FR2013/051433
§ 371 (c)(1),
(2) Date: Dec. 10, 2014

(87) PCT Pub. No.: WO2013/190236
PCT Pub. Date: Dec. 27, 2013

(65) Prior Publication Data
US 2015/0188549 A1    Jul. 2, 2015

(30) Foreign Application Priority Data
Jun. 19, 2012  (FR) ..................... 12 55707

(51) Int. Cl.
G06F 1/00  (2006.01)
H03L 7/08  (2006.01)
(Continued)

(52) U.S. Cl.
CPC ............... *H03L 7/08* (2013.01); *G06F 1/08* (2013.01); *H03L 7/093* (2013.01)

(58) Field of Classification Search
CPC ..... G06F 1/12; G06F 1/14; G06F 1/10; G06F 5/06; G06F 13/1689; G06F 1/08;
(Continued)

(56) References Cited

U.S. PATENT DOCUMENTS 5,257,294 A    10/1993  Pinto et al.
5,479,645 A *  12/1995  Sakai ................... G06F 1/08
                                                           713/501
(Continued)

FOREIGN PATENT DOCUMENTS

EP    0944172 A2    9/1999
EP    1 901 431 A2  5/2009
(Continued)

OTHER PUBLICATIONS

International Search Report issued on Jan. 2, 2014 for PCT application No. FR2013/051433 (WO2013/190236), 7 pages.
(Continued)

*Primary Examiner* — Zahid Choudhury
(74) *Attorney, Agent, or Firm* — Brinks Gilson & Lione

(57) ABSTRACT

A device for supplying an electronic circuit with a clock signal having a dock frequency includes a frequency actuator that generates the clock signal in accordance with a frequency setting according to a regulation mechanism. A control module selectively applies to the frequency actuator a first frequency setting or a second frequency setting that is higher than the first setting. An adaptation module modifies the regulation mechanism in accordance with the applied setting.

9 Claims, 2 Drawing Sheets

(51) Int. Cl.
  *G06F 1/08*        (2006.01)
  *H03L 7/093*       (2006.01)

(58) Field of Classification Search
  CPC ........ G06F 1/04; G06F 1/3202; G06F 9/4825;
         G06F 11/0757; G06F 11/3419; G11C
                                         7/22
  See application file for complete search history.

(56) References Cited

U.S. PATENT DOCUMENTS

| | | | | |
|---|---|---|---|---|
| 6,060,953 | A * | 5/2000 | Tsai | H03L 7/087 331/1 A |
| 6,236,278 | B1 * | 5/2001 | Olgaard | H03L 7/107 327/156 |
| 6,643,792 | B1 * | 11/2003 | Kurosawa | G06F 1/12 713/400 |
| 7,017,053 | B2 | 3/2006 | Mizuyabu | G06F 1/3203 345/212 |
| 7,352,249 | B2 | 4/2008 | Balboni et al. | |
| 7,898,343 | B1 | 3/2011 | Janesch | |
| 2002/0078391 | A1 * | 6/2002 | Yeh | G06F 1/3203 713/322 |
| 2003/0060177 | A1 * | 3/2003 | Noboru | H03L 7/10 455/260 |
| 2003/0065960 | A1 * | 4/2003 | Rusu | G06F 1/3203 713/300 |
| 2004/0139362 | A1 * | 7/2004 | Inaba | G06F 1/08 713/322 |
| 2004/0243878 | A1 * | 12/2004 | Kondo | G06F 1/10 713/600 |
| 2005/0073369 | A1 | 4/2005 | Balboni et al. | |
| 2005/0258906 | A1 | 11/2005 | Su et al. | |
| 2006/0203937 | A1 | 9/2006 | Burgio | |
| 2008/0006891 | A1 | 1/2008 | Gadeken et al. | |
| 2008/0284524 | A1 | 11/2008 | Kushiyama | |
| 2009/0020894 | A1 | 1/2009 | Holtz | |
| 2009/0108891 | A1 | 4/2009 | Sander et al. | |
| 2009/0138748 | A1 * | 5/2009 | Kim | G06F 1/08 713/503 |
| 2009/0174490 | A1 | 7/2009 | Jin | |
| 2010/0026352 | A1 | 2/2010 | Jacobowitz et al. | |
| 2010/0141233 | A1 * | 6/2010 | Kwok | H02M 1/44 323/351 |
| 2010/0199119 | A1 * | 8/2010 | Sun | G06F 1/08 713/500 |
| 2011/0004774 | A1 * | 1/2011 | Hansquine | G06F 1/3203 713/310 |
| 2011/0025424 | A1 | 2/2011 | Miyanaga | |
| 2011/0239033 | A1 * | 9/2011 | Chen | G06F 13/4291 713/502 |

FOREIGN PATENT DOCUMENTS

FR       2 926 172 A1    7/2009
WO    WO 2005/060103 A2   6/2005

OTHER PUBLICATIONS

Choudhary, Puru et al., "Hardware Based Frequency/Voltage Control of Voltage Frequency Island Systems", CODES+ISSS'06, Seoul, Korea Oct. 22-25, 2006, 6 pages.

Miermont, Sylvain et al., "A Power Supply Selector for Energy- and Area-Efficient Local Dynamic Voltage Scaling", Lecture Notes in Computer Science, vol. 4644, pp. 556-565, 2007, 10 pages.

* cited by examiner

SUPPLY DEVICE FOR SUPPLYING AN ELECTRONIC CIRCUIT

RELATED APPLICATION

This application is a U.S. nationalization of PCT Appl. No. PCT/FR2013/051433, filed Jun. 19, 2013, and published as PCT publication No. WO 2013/190236 on Dec. 27, 2013.

TECHNICAL FIELD

The invention concerns a supply device for supplying an electronic circuit with application of a clock signal.

BACKGROUND

When it is desired to minimize the energy consumption of a synchronous digital electronic circuit for which timing is provided by a clock signal, while maintaining its performance, it is known to apply to that circuit a clock frequency adapted to a given supply voltage. By "synchronous circuit" is meant a "circuit for which timing is provided by a clock".

It has moreover been proposed to adapt the clock frequency according to the performance desired for the system, and also to modify the supply voltage, a technique known under the acronym DVFS (for "Dynamic Voltage and Frequency Scaling").

These techniques are applied in particular in the case of GALS architectures (GALS standing for "Globally asynchronous Locally Synchronous"), in which the system concerned is divided into different VFIs (VFI standing for "Voltage Frequency Island"). Such architectures are for example produced in the form of SoCs (SoC standing for "System on Chip").

The variable supply voltage to apply to an electronic circuit is generated by a module named "voltage actuator", for example in accordance with the technique referred to as "Vdd-hopping", described in the paper "A power supply selector for energy- and area-efficient local dynamic voltage scaling", by S. Miermont, P. Vivet and M. Renaudin, in Lecture Notes in Computer Science, Volume 4644, pages 556-565, 2007.

As regards the clock signal of variable frequency to apply to the electronic circuit, this is generated by a module referred to as "frequency actuator"; such a frequency actuator is for example produced in the form of an FLL (for "Frequency Locked-Loop") or in the form of a PLL (for "Phase Locked-Loop").

Such frequency actuators are produced in the form of a system operating in a closed loop which includes in particular a controller influencing the variable generated according to the measured error (difference between the variable measured and the setting) and according to a control law.

SUMMARY

The invention provides a supply device for supplying an electronic circuit with application of a clock signal having a clock frequency, comprising a frequency actuator designed to generate the clock signal according to a frequency setting using a regulation mechanism, as well as a control module designed to selectively apply to the frequency actuator a first frequency setting or a second frequency setting higher than the first setting characterized by an adaptation module designed to modify the regulation mechanism according to the applied setting.

The regulation mechanism may thus be adapted to the applied setting, which makes it possible to obtain differentiated processing depending on whether the new setting is directed to an increase or a decrease in frequency.

The response time of the frequency actuator may thus be variable according to the sign of the frequency variation imposed by the new setting relative to the former setting.

The adaptation module then enables that response time to be increased or decreased respectively depending on whether the input setting is directed to an increase or a decrease in frequency.

In other words, the adaptation module may modify the regulation mechanism such that the response time of the frequency actuator increases or decreases respectively depending on whether the applied setting increases or decreases.

The response of the frequency actuator is thus differentiated according to the direction of variation of the frequency setting.

The frequency actuator comprises for example a controller receiving an error signal obtained by difference between the frequency setting and a measured frequency of the clock signal. The frequency actuator may also comprise an oscillator controlled by a control signal generated by the controller; the oscillator then for example generates the clock signal in this case.

According to a possibility for an embodiment, the adaptation module may comprise means for determining a gain of the oscillator by measurement of at least one value involved in the regulation mechanism and the adaptation module may then be designed to modify the regulation mechanism according to the determined gain. This makes it possible to adapt the regulation mechanism taking into account in real time the variations in the oscillator gain.

For example, when the controller is designed to apply a gain to the error signal, it can be provided for the adaptation module to be designed to control the gain applied by the controller according to the determined gain.

More generally, it may be provided for the adaptation module to be designed to modify an operating parameter of the controller. This is an effective and generally simple manner of implementation for the purpose of modifying the regulation mechanism.

As already stated, the controller may be designed to apply a gain to the error signal. The adaptation module is for example designed in this case to control the gain applied to the error signal.

In practice, it may be provided for a selector controlled by the adaptation module to be designed to selectively apply the error signal to a multiplier from among a plurality of multipliers.

According to another possibility, which may possibly be combined with the aforementioned gain control, the controller may comprise a memory designed to store a control value and the adaptation module may then be designed to force the memory to a predetermined value on detection of a setting jump. As explained below, this may enable faster convergence towards the setting.

According to a possibility for an embodiment, the device according to the invention may further comprise a voltage actuator designed to generate a voltage according to a voltage setting, adapted to the frequency setting, on application of that frequency setting to the frequency actuator.

The frequency and voltage actuators are thus synchronized.

BRIEF DESCRIPTION OF THE DRAWING

Other features and advantages of the invention will better appear on reading the following description, made with reference to the accompanying drawings in which.

DETAILED DESCRIPTION

Figure 1:
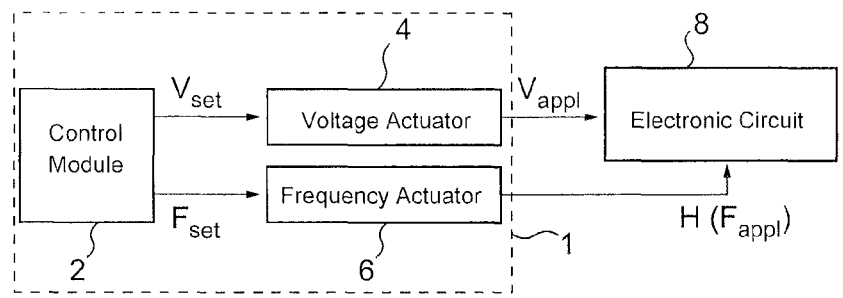
FIG. 1 represents a general context in which the present invention may be implemented.

As can be seen in FIG. 1, a supply device 1 for supplying an electronic circuit 8, for example a voltage frequency island (or VFI) of a GALS architecture, comprises a control module 2 which generates a voltage setting $V_{set}$ and a frequency setting $F_{set}$.

These settings are generated according to the desired performance for the electronic circuit 8, for example on the basis of instructions received and a date limit for their execution by an operation coordination module for different islands (not shown).

The voltage setting $V_{set}$ is applied to a voltage actuator 4 which generates, according to the voltage setting $V_{set}$, a voltage $V_{appl}$ applied to the electronic circuit 8.

The frequency setting $F_{set}$ is applied to a frequency actuator 6 which generates a clock signal H at a frequency $F_{appl}$ determined on the basis of the frequency setting $F_{set}$ as explained below. The clock signal H is applied to the electronic circuit 8.

The settings $V_{set}$, $F_{set}$ applied at a given time are such that they enable fault-free operation of the electronic circuit 8.

Thus, in order to pass from a first pair of values (voltage, frequency)$_1$ to a second pair of values (voltage, frequency)$_2$, the actions of the voltage and frequency actuators must be synchronized, in particular when the voltage and the frequency are modified within a determined timeslot.

These pairs of values may be determined in advance for a given circuit, for example according to prior investigations carried out on circuits of this type. As a variant, these values may be determined during a calibration phase during which, for each applied voltage, the operation of the circuit is tested for a plurality of envisioned clock frequencies, the highest frequency giving fault-free operation being chosen.

Settings $V_{set}$, $F_{set}$ adapted to fault-free operation are also used when modifications to these settings are made. For example, on a setting change or jump corresponding to a frequency increase, the voltage adapted to the highest frequency encountered during the jump is always applied, then the new frequency is applied once the voltage jump has been made.

The temporal response from the output of a conventional system to a change in setting is however not always adapted to the different situations encountered in operation. Below, "response" means the "temporal response of the output of such a system".

Thus, for example, the response of the system in closed loop as a whole may be influenced by phenomena such as the variability in the manufacturing process or variations in temperature encountered.

The constraints to comply with by the frequency generated may moreover differ according to the operational phases of the system: in a phase of frequency decrease (new setting less than the prior value), exceedance of the new setting (downwards) can be accepted, whereas such exceedance is unacceptable in the case of an increase in the frequency (new setting greater than the preceding setting) since it could lead to operating faults due to the use of a clock frequency greater than that intended (and for which an adapted voltage is applied to the circuit).

Figure 2:
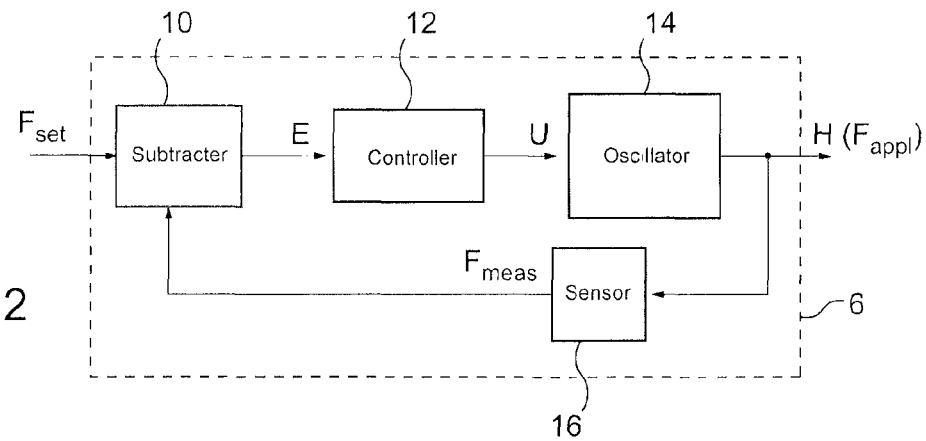
FIG. 2 represents the main components of a frequency actuator in accordance with the teachings of the invention.

FIG. 2 represents an example embodiment of the frequency actuator 6.

As already indicated, the frequency actuator 6 generates a clock signal H at a frequency $F_{appl}$ on the basis of a frequency setting $F_{set}$.

The frequency actuator 6 comprises a sensor 16 which measures the frequency of the clock signal H and generates a signal representing the measured frequency $F_{meas}$. When the information supplied by the sensor is numerical (that is to say a number), the sensor 16 is typically a counter which produces at its output the number of clock pulses measured in relation to the clock signal H over a predetermined time.

The frequency actuator 6 also comprises a subtracter 10 which determines the disparity (that is to say the difference) between the measured frequency $F_{meas}$ and the frequency setting $F_{set}$ and generates an error signal E representing the computed disparity.

The frequency actuator 6 comprises a controller 12 which receivers the error signal E and which generates, on the basis of that error signal E and according to a control law, a control signal U for the system 14 to control, here a DCO (DCO standing for "Digitally Controlled Oscillator").

As referred to previously, a disparity or exceedance of the new setting is tolerated when it entails a decrease in frequency, but such an exceedance is unacceptable in the case of a setting entailing an increase in frequency.

The error signal E, in particular its sign, makes it possible to determine whether the exceedance concerned is a decrease or an increase in the frequency, and to provide actions (governed by the control law) to avoid possible operating faults of the circuit 8 due classically to the exceedance of the frequency response of the actuator 6 relative to the setting. The digitally controlled oscillator 14 comprises a digital-analog converter and a VCO (VCO standing for "Voltage Controlled Oscillator"). The digitally controlled oscillator 14 thus generates an output signal of which the frequency is controlled by the control signal U: that output signal is the clock signal H generated by the frequency actuator 6.

The notation $K_{DCO}$ will be used below in relation to the gain of the oscillator 14.

It is to be noted that, in the embodiment described here, the signals representing the different variables $F_{meas}$, $F_{set}$, E and U are digital words and the controller 12 in particular is thus a digital circuit. As a variant, it could naturally be provided that some of the signals, and therefore possibly the controller, be produced in analog form.

Figure 3A:
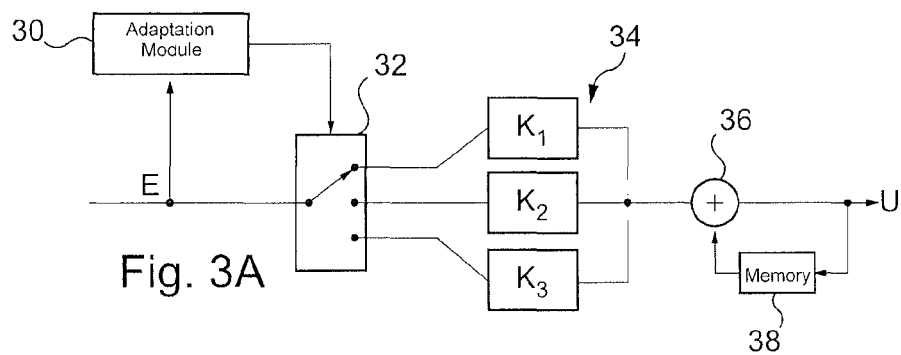
FIG. 3A represents a first example embodiment of the controller of FIG. 2.

FIG. 3A represents a first example embodiment of the controller of 12 of FIG. 2.

Figure 3B:
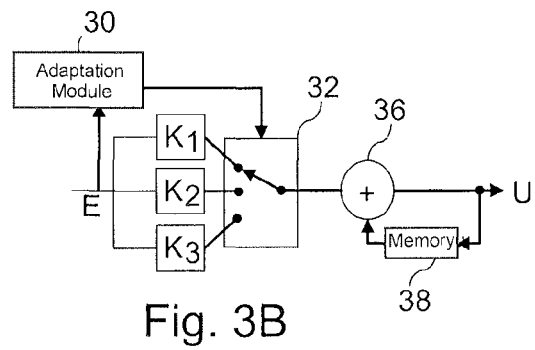
FIG. 3B represents a variant embodiment of the first example embodiment.

In this embodiment, the error signal E is applied selectively to a multiplier (for example that of coefficient $K_1$ in FIG. 3) from among a plurality of multipliers 34 (here three multipliers with respective coefficients $K_1$, $K_2$, $K_3$) by means of a selector 32 controlled by an adaptation module 30. A version in which the signal E would be applied to all the multipliers 34 and in which the selector 32 controlled by an adaptation module 30 would choose one of the output signals from the multipliers 34 may also be provided, see FIG. 3B.

Returning to the embodiment of FIG. 3A, the output from each multiplier 34 is applied to an adder circuit 36 which also receives as input its own output signal, delayed by a time determined by passage through a memory 38 provided for that purpose.

Such a controller is of integrator type and at the time k generates as output a control signal $U(k)=K_i \cdot E(k)+U(k-1)$, where $U(k-1)$ is the control signal at the time $(k-1)$ and $K_i$ is the coefficient of the selected multiplier.

It is understood that the value of the parameter $K_i$ influences on the time taken by the controller 12 to generate a control signal U which leads to a signal frequency of clock H equal to the setting $F_{set}$ (that is to say a null error signal E), since the value of $K_i$ determines the magnitude of the variations in the control signal U at each time according to the formula which has just been given.

A high value of the parameter $K_i$ thus leads to a fast variation in the control signal U, which may go as far as an exceedance of the setting (even though the signal will end up converging towards the setting since the exceedance thereof leads to a change in sign of the error signal E).

It is furthermore to be noted that the gain $K_{DCO}$ of the oscillator 14 is variable according to the operating conditions (such as the temperature) and may thus also have an effect on the response time of the looped system (since an error signal E induces a modification $K_i \cdot E$ of the control signal U and thus a modification $K_{DCO} \cdot K_i \cdot E$ of the frequency $F_{appl}$ of the clock signal H).

It may be provided for the adaptation module 30 to control the selector 32:

so as to apply the multiplier of coefficient $K_1$ to the error signal E when the change in setting $F_{set}$ corresponds to a decrease in the desired frequency;

so as to apply the multiplier of coefficient $K_2$ (with $K_2<K_1$) when the change in setting $F_{set}$ corresponds to an increase in the desired frequency and when the ambient temperature T is greater (or, according to a possible variant, lower) than a predetermined threshold $T_0$.

so as to apply the multiplier of coefficient $K_3$ (with $K_3<K_2$) to the error signal E when the change in setting $F_{set}$ corresponds to an increase in the desired frequency and when the temperature T is less (or, according to the variant which has just been mentioned, greater) than the predetermined threshold $T_0$.

The multiplier coefficients $K_1$, $K_2$, $K_3$ are for example predetermined according to the operating values provided for the system. These values may come from an off-line calibration phase or be produced during operation of the system. The use of these coefficients makes it possible to vary the response time of the frequency actuator according to the sign of the frequency variation imposed by the new setting relative to the former setting.

The adaptation module 30 determines the control to apply to the selector 32 for example according to the error signal E (which gives whether the next frequency modification will be a frequency decrease or a frequency increase) and a measurement of the ambient temperature T.

As a variant it could be provided for the adaptation module 30 to determine the control to apply to the selector 32 on the basis of the frequency setting $F_{set}$ applied to the frequency actuator 6. For example, in a system in which two frequency settings are provided (low frequency and high frequency), the adaptation module 30 may control the application of the multiplier $K_1$ when the setting corresponds to the low frequency and the application of the multiplier $K_2$ or $K_3$ (according to the measured temperature T) when the setting corresponds to the high frequency.

Figure 4:
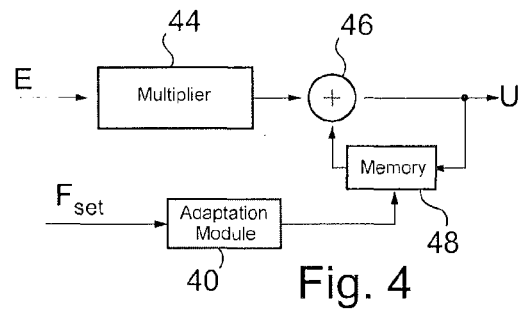
FIG. 4 represents a second example embodiment of the controller of FIG. 2.

FIG. 4 represents a second embodiment of the controller of 12 of FIG. 2.

In this embodiment, the error signal E is applied to a multiplier 44 of coefficient $K_i$ (for example fixed). The output of the multiplier 44 is applied to an adder 46 which also receives as input a version which is delayed (using a memory 48) from its output U.

The memory 48 is for example produced in the form of a register having a predetermined size (for example 8 bits).

The controller also comprises an adaptation module 40 which makes it possible to force the value contained in the memory 48 to a predetermined value, for example when the adaptation module 40 detects a downward change in frequency setting $F_{set}$.

The predetermined value written by the adaptation module 40 on detection of a downward jump in frequency setting may however be variable, according to the new frequency setting: the adaptation module 40 may for example store, in a look-up table, a predetermined value to write in the memory 48 for each of a plurality of ranges of frequency setting value $F_{set}$, or for a set of successive control times subsequent to the jump.

The coefficient $K_i$ of the multiplier 44, which is fixed in the example described here, is for example chosen so as to avoid an exceedance of the setting at the time of an upward jump in frequency setting (that is to say that the new frequency setting is greater than the prior frequency setting) in the operating conditions envisioned for the system. It is to be noted that, at the time of such an upward jump in frequency setting, the adaptation module 40 does not act on the memory 48 such that the controller 12 operates so as to make the measured frequency $F_{meas}$ converge towards the frequency setting $F_{set}$ (starting from the actual frequency prior to the frequency jump).

At the time of such an upward jump (or positive jump), the control signal is thus governed as follows: $U(k)=K_i \cdot E(k)+U(k-1)$.

On the other hand, when the adaptation module 40 detects a downward jump in frequency setting $F_{set}$ (or negative jump, that is to say that the new frequency setting is less than the prior frequency setting), the adaptation module forces the value in memory 48 to a predetermined value $U_0$ (which depends for example as explained above on the new setting $F_{set}$).

At the time k following the jump, the control signal $U(k)$ thus has the value: $U(k)=K_i \cdot E(k)+U_0$.

The predetermined value $U_0$ is chosen, for example at the time the system is designed, such that the new control value $U(k)$ leads, after application to the oscillator 14, to a clock having a frequency equal to or less than the new setting $F_{set}$ according to the parameters provided for the operation of the system, in particular the coefficient $K_{DCO}$ already mentioned for the oscillator 14. It is noted that, when the established regime (corresponding to a situation in which the output frequency has attained the setting and no longer changes) was attained before application of the setting change, the value of the error signal E at the time of the jump in principle corresponds at that time to the difference between the new setting and the prior setting.

Naturally, the temporal behavior of the actual frequency generated by the oscillator 14 on account of the control $U(k)$ does not precisely correspond to the temporal behavior expected further to the application of the new frequency setting $F_{set}$, in particular on account of drifts that are present relative to the theoretical operation, and on account of the modification of the value in memory via the adaptation module 40. The actual clock frequency $F_{appl}$ generated by the oscillator 14 will however converge towards the frequency setting $F_{cons}$ on account of the resumption in integrator operation by the controller 12, for example according to the formula $U(k+1)=K_i \cdot E(k+1)+U(k)$ at the following time $(k+1)$.

It may be specified here in this connection that the adaptation module 40 only forces the value in the memory 48 to the predetermined value $U_0$ at the time at which the downward setting jump $F_{set}$ is detected. The rest of the time, the memory 48 receivers the value output from the adder 46 as already indicated.

It may be understood that, the predetermined value $U_0$ being chosen to generate a clock frequency in theory equal to that of the setting $F_{set}$, the actual frequency $F_{appl}$ generated in practice rapidly converges towards the setting $F_{set}$, the response (or convergence) time of the frequency actuator varying accordingly.

Furthermore, it is of no importance that the frequency actually generated on application of the predetermined value $U_0$ to the memory 48 is greater than or less than the setting $F_{set}$ envisioned since the voltage $V_{appl}$ applied at the time of the jump is as already stated sufficient to ensure error-free operation of the electronic circuit 8 even at frequencies greater than the new frequency setting $F_{set}$. (Typically, the voltage $V_{appl}$ applied at the time of the jump is that previously applied for safe operation with the prior setting, which is greater than the new setting in the case of the downward jump envisioned here.)

Figure 5:
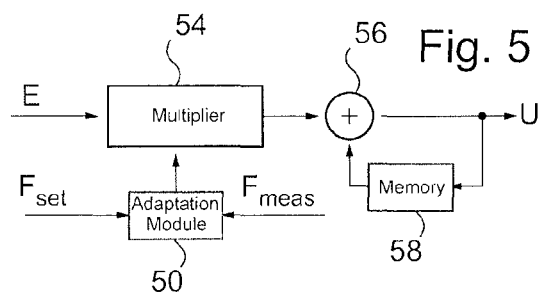
FIG. 5 represents a third example embodiment of the controller of FIG. 2.

FIG. 5 represents a third embodiment of the controller of 12 of FIG. 2.

In this embodiment, the error signal E is applied to a multiplier 54 of coefficient $K_i$ which is variable under the control of an adaptation module 50.

The signal output from the multiplier 54 is applied to an adder 56, which also receives as input its own output U delayed using a memory 58.

As previously, the signal U output from the adder 56 is applied to the oscillator 14.

In this embodiment it is provided for the adaptation module 50 to receive both the frequency setting $F_{set}$ and the measured frequency $F_{meas}$.

On detection of a positive setting jump (that is to say an increase in the setting) by the adaptation module 50 (that is to say a variation in the setting $F_{set}$ that it receives), the adaptation module measures the actual convergence time $t_{conv}$ of the frequency towards its setting, that is to say for example the time taken (from the detection of the frequency jump) by the measured frequency signal $F_{meas}$ to f reach the setting, to the nearest given percentage (for example to the nearest 5%).

The adaptation module 50 also determines whether, during the convergence time, the measured frequency $F_{meas}$ goes beyond the new frequency setting $F_{cons}$.

Once the convergence time has been measured and the existence of any exceedance has been determined, the adaptation module 50 modifies the coefficient $K_i$ of the multiplier 54 as follows:

if the adaptation module 50 has found the existence of an exceedance of the setting $F_{set}$, the gain $K_i$ is rendered by a predefined increment $d_K$;

if no exceedance is detected and the convergence time $t_{conv}$ is less than a first predetermined time $t_0$ (minimum acceptable), the gain is also rendered by a predefined increment, for example the same increment $d_K$;

if no exceedance is detected and the convergence time $t_{conv}$ is greater than a second predetermined time $t_1$ (maximum acceptable), the gain $K_i$ is increased by a predefined increment, for example equal to the increment $t_K$ already mentioned.

Thus, the value of the gain $K_i$ will be continually adapted so as to avoid an exceedance of the frequency setting $F_{set}$ and to obtain a convergence time comprised between the predetermined times $t_0$ and $t_1$.

It is to be noted that the procedure which has just been described is applied in the case of a positive jump in setting due to the fact that it is wished to avoid the exceedance of the setting for this type of jump, as already explained.

A similar procedure could also be applied to a negative jump in setting in order to continually adapt the convergence time. The procedure could then be applied after a first modification to the gain $K_i$ (in order to use an initial gain adapted to the negative jump) in accordance with the embodiment of FIGS. 3A and 3B.

The frequency response time of the actuator may thus be varied according to the direction of variation of the setting.

Figure 6:
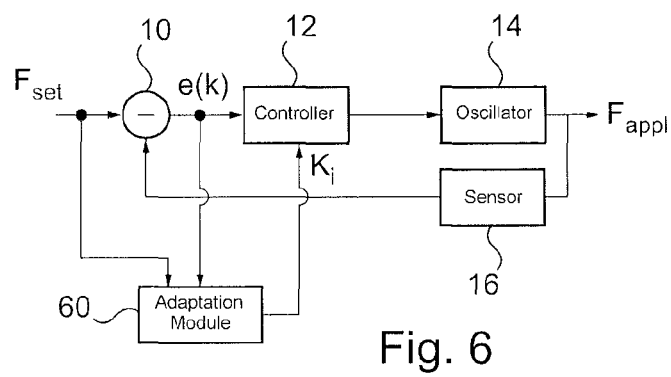
FIG. 6 represents a fourth embodiment of the invention.

FIG. 6 illustrates another embodiment of the invention.

This embodiment is based on a closed-loop architecture as described above with reference to FIG. 2.

In this embodiment, an adaptation module 60 receives the frequency setting values $F_{set}$ and the error values E (already introduced in the context of FIG. 2) and on that basis generates a gain $K_i$ which it sends to the controller 12 in order for the latter to apply that gain $K_i$ to the error signal E.

The present embodiment is moreover based on an operation of modeling the different blocks by means of a transfer function of z, as represented in FIG. 6.

The closed loop transfer function (that is to say that of the system in FIG. 6 as a whole) is written:

$$\frac{F_{appl}(z)}{F_{set}(z)} = \frac{K_I K_{DCO}}{1-(1-K_I K_{DCO} K_S)z^{-1}}$$

and $$\frac{E(z)}{F_{setting}(z)} = \frac{1}{1+\frac{K_I K_{DCO} K_S}{(z-1)}} = \frac{z-1}{z-(1-K_I K_{DCO} K_S)} = \frac{1-z^{-1}}{1-(1-K_I K_{DCO} K_S)z^{-1}}.$$

By denoting $E(k)$ and $F_{set}(k)$ as the values of the error signal E and of the frequency setting $F_{set}$ at the time k, the following temporal expression is obtained for the error $e(k)$:

$$E(k)=F_{setting}(k)-F_{setting}(k-1)+(1-K_I K_{DCO} K_S) \cdot E(k-1).$$

The case is taken for example in which the system has attained a state of equilibrium at a given time (here denoted $k=-1$), i.e. $E(-1)=0$, and in which, at a given time $(k=0)$, the setting is modified stepwise, i.e. $F_{set}(0)-F_{set}(-1)=\Delta F$. We thus have: $E(0)=\Delta F$.

At the following time $(k=1)$, we have $F_{set}(1)-F_{set}(0)=0$ (on account of the step form of the setting) and:

$$E(1)=(1-K_I K_{DCO} K_S) \cdot E(0)=(1-K_I K_{DCO} K_S) \cdot \Delta F.$$

By measuring $E(1)$ and taking into account the fact that $E(0)$ is equal to the change in setting, the adaptation module may compute the gain $K_{DCO}$ by:

$$K_{DCO} = \frac{\left(1 - \frac{E(1)}{\Delta F}\right)}{K_I K_S}.$$

It is to be noted that in established operating regime, the gain $K_I$ is known by the adaptation module 60 (since it is generated and controlled by that module as described below). A fixed initialization value may furthermore be provided. As regards the gain $K_S$ of the sensor 16, this is constant and may thus be considered as a fixed value of the system, stored for example at the adaptation module 16.

The gain $K_{DCO}$ of the oscillator 14 is thus computed on the basis of the measurement of the input signal $E(1)$ at a frequency jump, without opening the feedback control/regulation loop, and without having to take two measurement points.

It is noted that the above also applies when the change in setting is not a step, taking into account the particular successive values of the frequency setting.

Several measurement points may moreover be used. In that case it is then a matter of minimizing a quadratic criterion which depends on the gain $K_{DCO}$, the other parameters $K_I$ and $K_S$ being considered to be known. A non-linear programming method may for example be implemented, as described in the work "*Practical methods of optimization*", R. Fletcher, $2^{nd}$ edition, Wiley, ISBN 13: 978 0 471 91547 8. A least squares error method may also be implemented, which is non-optimal in this case since the problem is not linear in K), but for which the result will be entirely satisfactory if the hypothesis is made that the noise level is low.

Whatever the determination technique used, it is possible to determine, thanks to the knowledge of the gain of the oscillator 14, the gain $K_I$ to use at the time of the following jump to obtain a particular shape for the response as follows.

By considering the equations reviewed above, it is found that the pole $\alpha$ of the closed loop system is written: $\alpha = 1 - K_I K_{DCO} K_S$. Yet this pole is directly linked to the shape of the desired response, that is to say to the response time, for example at 5%, and to the transient shape of the temporal response (see on this subject the work "*Analyse des Systèmes linéaires*", (a translation of this French title being "Analysis of non-linear systems"), under the direction of Ph. de Larminat, collection I2C, Hermes, ISBN 2-7462-0491-6).

It is provided to use predetermined values for the pole $\alpha$, that are characteristic of the response shape, here a predetermined value $\alpha_P$ for the positive setting jumps and a predetermined value $\alpha_N$ for the negative setting jumps (the differentiation between positive jump and negative jump being useful for the reasons already set out above).

Thus, when the adaptation module 60 detects a positive setting jump $F_{set}$, it actuates the controller 12 to use a gain $$K_I = \frac{1 - \alpha_P}{K_{DCO} K_S};$$

on the other hand, when the adaptation module 60 detects a negative setting jump $F_{set}$, it actuates the controller 12 to use a gain $$K_I = \frac{1 - \alpha_N}{K_{DCO} K_S}.$$

It is noted that, in both cases, the value of the gain $K_{DCO}$ used is that determined as indicated above by measurement at the previous jump (a default value may naturally be used if no measurement has been made previously, for example on initialization of the process).

The foregoing embodiments are merely possible examples of implementation of the invention, which is not limited thereto.

For example, the determination of the oscillator gain $K_{DCO}$ by measurement, presented with reference to FIG. 6, could be used in the context of the embodiment of FIG. 4, which would make it possible to vary the value $U_0$ according to the gain $K_{DCO}$ determined (the value $U_0$ chosen depending in particular on the oscillator gain $K_{DCO}$ as indicated above).

The invention claimed is:

1. A synchronous digital electronic circuit in which timing is provided with a clock signal having a clock frequency, the device comprising:
   a frequency actuator comprising a controller and including an oscillator controlled by a control signal generated by the controller and that generates the clock signal according to a frequency setting using a regulation mechanism,
   wherein the controller receives an error signal obtained by a difference between the frequency setting and a measured frequency of the clock signal, the controller being configured to apply a gain to the error signal;
   a control module that selectively applies a first frequency setting or a second frequency setting higher than the first setting to the frequency actuator; and
   an adaptation module configured to modify the regulation mechanism according to the applied frequency setting by controlling the gain applied by the controller, such that when the frequency setting is increased, the gain applied by the controller decreases for increasing the response time of the frequency actuator, and when the frequency setting is decreased, the gain applied by the controller increases for decreasing the response time of the frequency actuator.

2. The device according to claim 1, wherein the adaptation module controls the gain applied by the controller according to the gain of the oscillator.

3. The device according to claim 1, wherein the adaptation module is configured to modify an operating parameter of the controller.

4. A supply device according to one of claim 1, wherein the controller is configured to apply a gain to the error signal.

5. The device according to claim 4, wherein the adaptation module is configured to control the gain applied to the error signal.

6. The device according to claim 5, wherein a selector controlled by the adaptation module is configured to selectively apply the error signal to a selected multiplier from among a plurality of multipliers.

7. The device according to claim 6, wherein the controller comprises a memory configured to store a control value and the adaptation module stores in the memory a predetermined value on detection of a setting jump.

8. The device according to claim 1, further comprising a voltage actuator configured to generate a voltage according to a voltage setting adapted to the frequency setting, on application of the frequency setting to the frequency actuator.

9. A synchronous digital electronic circuit in which timing is provided with a clock signal having a clock frequency, the device comprising:

a frequency actuator comprising a controller and including an oscillator controlled by a control signal generated by the controller and that generates the clock signal according to a frequency setting using a regulation mechanism, a control module that selectively applies a first frequency setting or a second frequency setting higher than the first setting to the frequency actuator; and an adaptation module configured to modify the regulation mechanism according to the applied frequency setting by controlling the gain applied by the oscillator such that when the frequency setting is increased, the gain applied by the oscillator decreases for increasing the response time of the frequency actuator, and when the frequency setting is decreased, the gain applied by the oscillator increases for decreasing the response time of the frequency actuator.

* * * * *

UNITED STATES PATENT AND TRADEMARK OFFICE
CERTIFICATE OF CORRECTION

PATENT NO. : 9,729,156 B2
APPLICATION NO. : 14/406973
DATED : August 8, 2017
INVENTOR(S) : Diego Puschini Pascual et al.

It is certified that error appears in the above-identified patent and that said Letters Patent is hereby corrected as shown below:

On the Title Page

Right column, Line 2, under ABSTRACT, after "signal having a" replace "dock" with --clock--.

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*